United States Patent
Tsay et al.

(10) Patent No.: US 7,897,200 B2
(45) Date of Patent: Mar. 1, 2011

(54) ULTRATHIN FERROMAGNETIC/ANTIFERROMAGNETIC COUPLING FILM STRUCTURE AND FABRICATION METHOD THEREOF

(75) Inventors: Jyh-Shen Tsay, Chia-Yi (TW); Chi-Wei Lee, Chia-Yi (TW); Gung Chern, Chia-Yi (TW)

(73) Assignee: National Chung Cheng University (TW)

( * ) Notice: Subject to any disclaimer, the term of this patent is extended or adjusted under 35 U.S.C. 154(b) by 120 days.

(21) Appl. No.: 12/183,164

(22) Filed: Jul. 31, 2008

(65) Prior Publication Data

US 2009/0117355 A1   May 7, 2009

(30) Foreign Application Priority Data

Nov. 7, 2007   (TW) ................. 96141973 A

(51) Int. Cl.
| | |
|---|---|
| *G11B 21/00* | (2006.01) |
| *G11B 5/33* | (2006.01) |
| *B05D 1/18* | (2006.01) |
| *B32B 7/02* | (2006.01) |
| *C25D 3/12* | (2006.01) |
| *C25D 3/00* | (2006.01) |
| *G11C 19/08* | (2006.01) |
| *B22F 3/00* | (2006.01) |
| *C23C 8/10* | (2006.01) |

(52) U.S. Cl. ......... 427/130; 427/127; 427/128; 427/131; 427/430.1; 427/436; 428/212; 428/811; 428/900; 205/261; 205/269; 360/313; 365/87; 365/173; 252/62.55; 148/286

(58) Field of Classification Search .......... 427/127–131, 427/430.1, 436; 428/212, 811, 900; 205/261, 205/269; 360/313; 365/173, 87; 252/62.55; 148/286
See application file for complete search history.

(56) References Cited

U.S. PATENT DOCUMENTS

| | | | | |
|---|---|---|---|---|
| 3,110,613 | A * | 11/1963 | Bean | 336/234 |
| 3,582,912 | A * | 6/1971 | Valin et al. | 365/173 |
| 3,961,990 | A * | 6/1976 | Koester et al. | 148/286 |
| 4,581,109 | A * | 4/1986 | Goor et al. | 205/176 |
| 5,889,640 | A * | 3/1999 | Hayashi et al. | 360/324.11 |
| 5,932,343 | A * | 8/1999 | Hayashi et al. | 428/332 |
| 6,083,632 | A * | 7/2000 | Fujikata et al. | 428/611 |
| 6,147,843 | A * | 11/2000 | Yamamoto et al. | 360/313 |
| 6,353,316 | B1 * | 3/2002 | Amano | 324/252 |

OTHER PUBLICATIONS

Lew et al "Temperature dependence of spin waves in Co/CoO bilayers" Jun. 1, 2001, Journal of App. phys. vol. 89, No. 11; p. 7654-7656.*

* cited by examiner

*Primary Examiner* — Timothy H Meeks
*Assistant Examiner* — Mandy C Louie
(74) *Attorney, Agent, or Firm* — Schmeiser, Olsen & Watts, LLP

(57) ABSTRACT

The present invention provides a ferromagnetic/antiferromagnetic coupling film structure and a fabrication method thereof. The structure includes an antiferromagnetic layer of cobalt oxide having a thickness of 2 to 15 monolayers and formed on a substrate at a temperature ranging from 700K to 900K; and a ferromagnetic layer of cobalt having a thickness of at least one monolayer for being formed on the antiferromagnetic layer of cobalt oxide.

4 Claims, 7 Drawing Sheets

ULTRATHIN FERROMAGNETIC/ANTIFERROMAGNETIC COUPLING FILM STRUCTURE AND FABRICATION METHOD THEREOF

BACKGROUND OF THE INVENTION

1. Field of Invention

The present invention relates to ultrathin ferromagnetic/antiferromagnetic coupling film structures and fabrication methods thereof, and more particularly, to a ferromagnetic/antiferromagnetic coupling film structure used in a multilayer film of a spin valve and a fabrication method thereof.

2. Description of Related Art

Recording media can be divided in terms of recording means into 4 groups: magnetic recording, optical recording, magneto-optical recording and semiconducting recording media. Among them, magnetic recording and optical recording media are the two mainly used. Giant magnetoresistance (GMR), which is shown in a magnetical multilayer film formed by alternate growth of ferromagnetic layers and non-ferromagnetic layers, has been used in read head and attracted extensive researches, and a spin valve multilayer film having the exchange coupling effect is considered to be the most potential system.

The spin valve multilayer film structure includes antiferromagnetic layer/ferromagnetic layer I/spacer layer/ferromagnetic layer II, wherein the exchange coupling effect between the antiferromagnetic layer and the ferromagnetic layer is a key property in a spin valve system. Generally, in a research of the exchange magnetic anisotropy between the ferromagnetic layer and the antiferromagnetic layer, the ferromagnetic layer is generally made of a ferromagnetic 3d transition metal such as Fe, Co or NiFe. There are four groups of antiferromagnetic layers, i.e. (1) ferromagnetic metal oxides, such as CoO film and NiO film; (2) alloys made of Mn and ferromagnetic metals such FeMn film, NiMn film and CoMn film; (3) alloys made of Mn and other transition metals such as PtMn film, PdMn film and IrMn film; and (4) other metal films such as $FeF_2$.

Exchange bias coupling was found from Co and tiny particles on the oxide layer. Furthermore, antiferromagnetic films formed by insulating transition metal oxides such as CoO film and NiO film have simple and stable chemical and magnetic structures, and also have excellent anticorrosive and anti-oxidative properties. Accordingly, the antiferromagnetic film can be used in a spin valve system for preventing the current shunting effect.

However, it is still desired to have an ultrathin ferromagnetic/antiferromagnetic film structure used in a spin valve multilayer film structure and a fabrication method thereof.

SUMMARY OF THE INVENTION

The objective of the present invention is to provide an ultrathin ferromagnetic/antiferromagnetic film structure capable of being used in a spin valve type GMR head system, and a fabrication method thereof.

To achieve the above and other objectives, the present invention provides a ferromagnetic/ antiferromagnetic coupling film structure inclding: a substrate; an antiferromagnetic layer of cobalt oxide having a thickness of 2 to 15 monolayers and formed on the substrate at a temperature ranging from 700K to 900K; and a ferromagnetic layer of cobalt having a thickness of at least one monolayer formed on the antiferromagnetic layer of cobalt oxide.

The present invention also provides a fabrication method of a ferromagnetic/antiferromagnetic coupling film structure. The method includs the steps of: plating a first cobalt film having a thickness of at least two monolayers on a substrate; exposing the first cobalt film to oxygen atmosphere until saturation; heating the first cobalt film at a temperature ranging from 700K to 900K to make oxygen evenly react with cobalt so as to form an antiferromagnetic layer of cobalt oxide having a thickness of 2 to 15 monolayers; and plating a second cobalt film on the antiferromagnetic layer of cobalt oxide, allowing the second cobalt film to form a ferromagnetic layer of cobalt, so as to form the ferromagnetic/antiferromagnetic coupling film structure. After the film structure is field-cooled, its magnetism is measured by Surface Magneto-Optic Kerr Effect (SMOKE). A phenomenon of a shifted hysteresis loop is found, which indicates that the film is an excellent ferromagnetic/antiferromagnetic film. The strength of exchange coupling can be varied by modulating the thickness of the antiferromagnetic layer so as to obtain the best condition of the exchange coupling between the ferromagnetic layer and the antiferromagnetic layer. The film structure is particularly suitable for use in manufacturing magnetic recording media.

DETAILED DESCRIPTION OF THE PREFERRED EMBODIMENTS

Figure 1A:
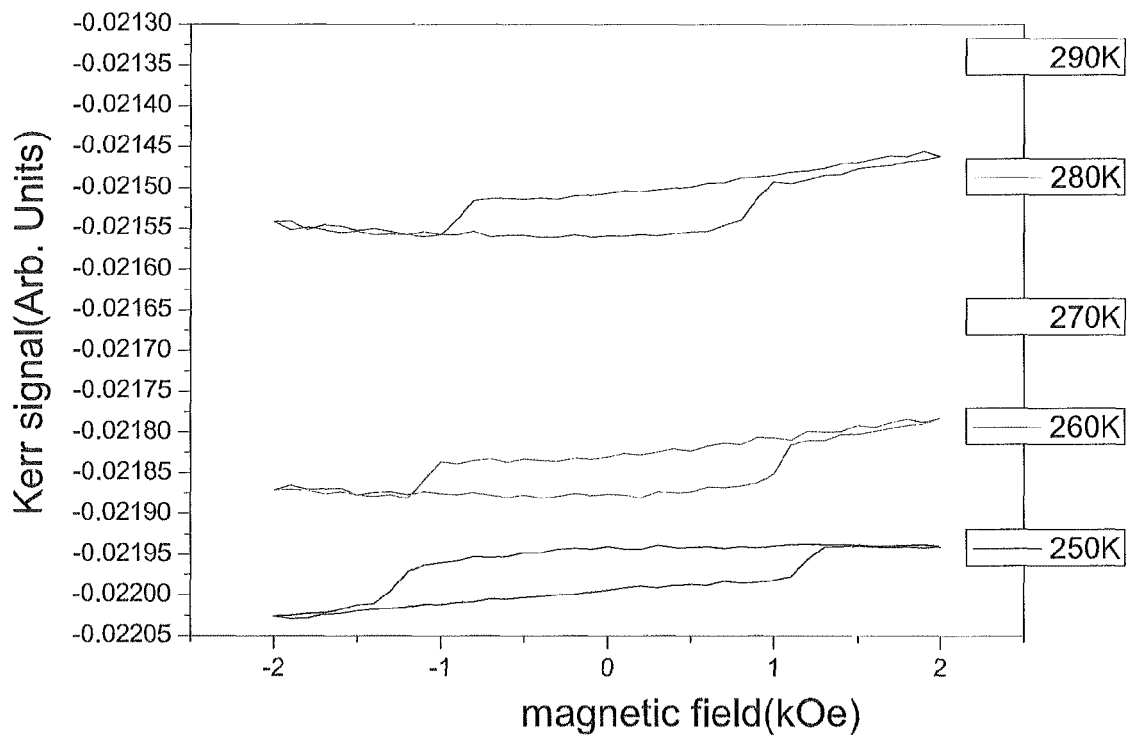
FIG. 1(a) shows a polar SMOKE diagram at different temperatures of the film sample 1 having a structure of O/1 ML Co/2 ML CoO/Ir (111) according to Example 1 of the present invention.
Figure 1B:
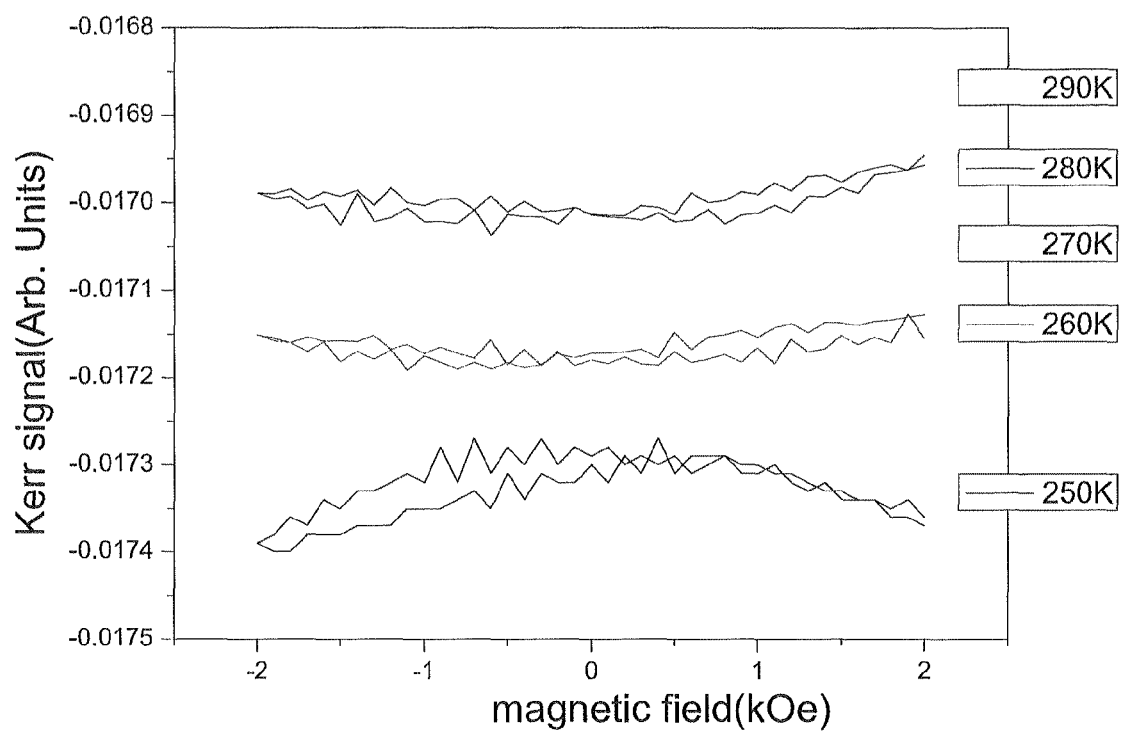
FIG. 1(b) shows a longitudinal SMOKE diagram at different temperatures of the film sample 1 having a structure of O/1 ML Co/2 ML CoO/Ir (111) according to Example 1 of the present invention.
Figure 1C:
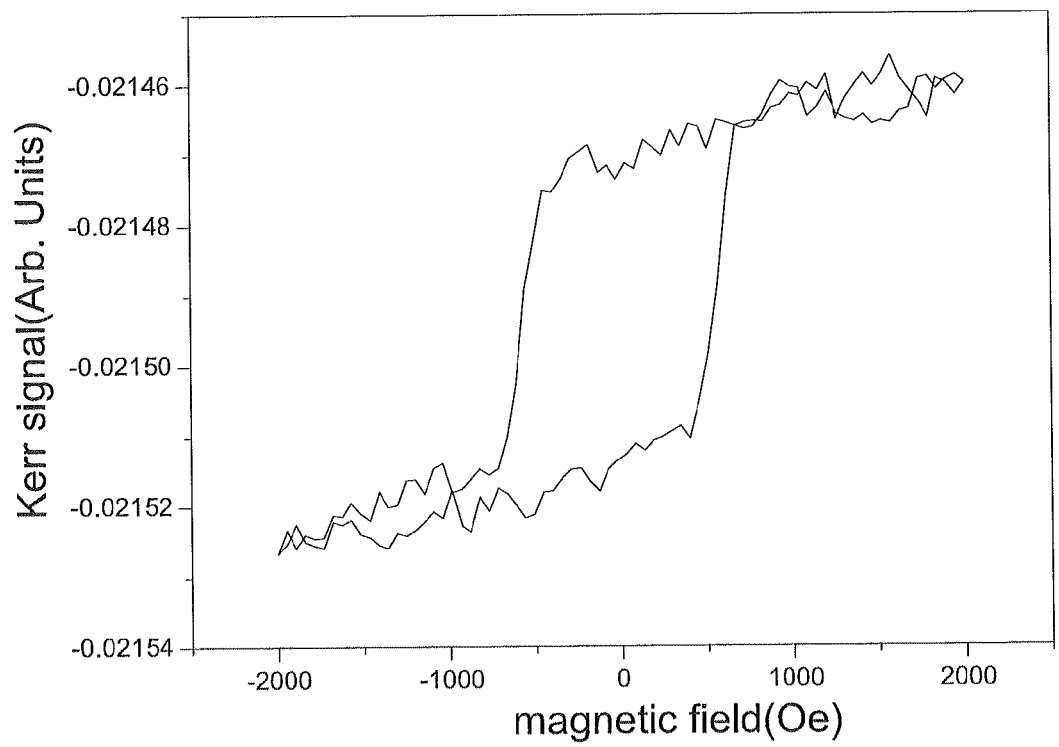
FIG. 1(c) shows a polar SMOKE diagram at 300 K of the film sample 1 having a structure of O/1 ML Co/2 ML CoO/Ir (111) according to Example 1 of the present invention.
Figure 1D:
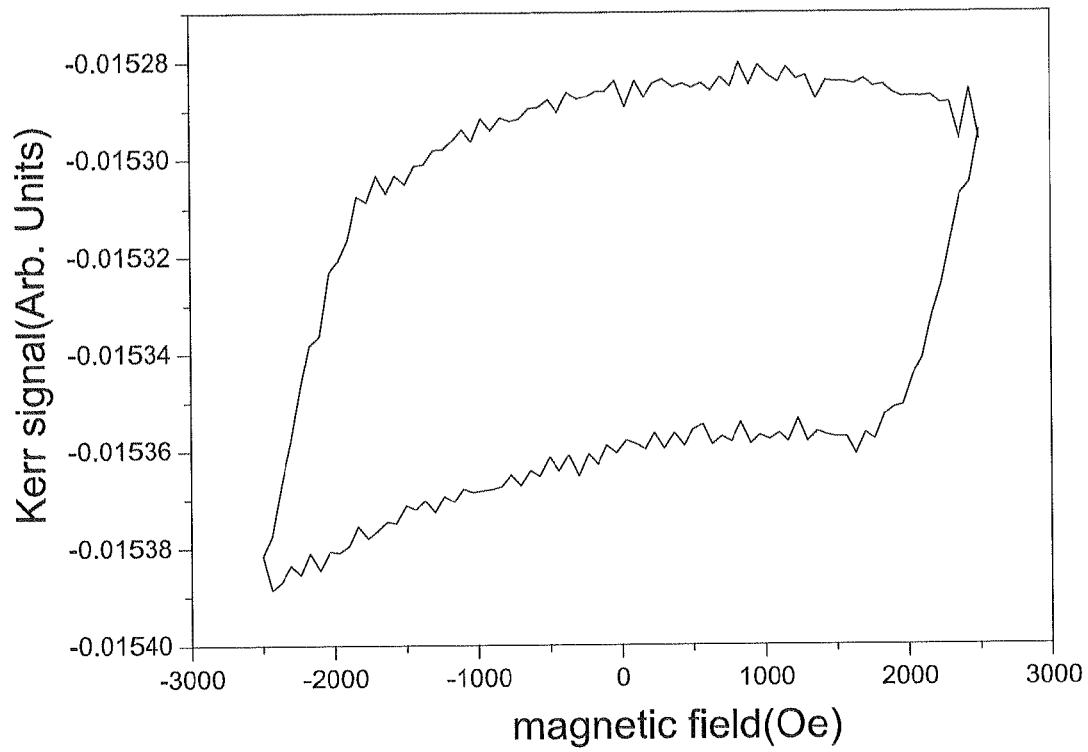
FIG. 1(d) shows a longitudinal SMOKE diagram at 300 K of the film sample 1 having a structure of O/1 ML Co/2 ML CoO/Ir (111) according to Example 1 of the present invention.

The characteristics and effects of the present invention are further illustrated by the following embodiments and figures.

A ferromagnetic/antiferromagnetic coupling film structure of the present invention includes a substrate, an antiferromagnetic layer of cobalt oxide formed on a surface of the substrate, and a ferromagnetic layer of cobalt formed on a surface of the antiferromagnetic layer of cobalt oxide. The exchange bias in the cobalt and cobalt oxide system causes a phenomenon of a shifted hysteresis loop. In the film structure of the present invention, the shifting of the hysteresis loop can be more obvious by increasing the thickness of the antiferromagnetic layer of cobalt oxide. Therefore, in the coupling film structure of the present invention, a better condition for coupling ferromagnetic layers and antiferromagnetic layers can be obtained by modulating the thickness of the antiferromagnetic layer of cobalt oxide. In one embodiment, the coupling film structure of the present invention includes an antiferromagnetic layer of cobalt oxide having a thickness of 2 to 15 monolayers, preferably 2 to 8 monolayers, and more preferably 2 to 4 monolayers.

Furthermore, at a specific temperature, a polar exchange field ($H_E$) of the ferromagnetic/antiferromagnetic coupling film presents an inversion relationship with the thickness of a ferromagnetic layer of cobalt. Therefore, the coupling film structure of the present invention includes a ferromagnetic layer of cobalt having a thickness of 1 to 15 monolayers, preferably 1 to 8 monolayers, and more preferably 1 to 4 monolayers.

In the present invention, a fabrication method of a ferromagnetic/antiferromagnetic coupling film includes the steps of: (a) plating a first cobalt film having a thickness of at least two monolayers on a surface of a substrate; (b) exposing the first cobalt film to oxygen atmosphere until saturation; (c) heating the first cobalt film at a temperature ranging from 700K to 900K to make oxygen evenly react with cobalt so as to form an antiferromagnetic layer of cobalt oxide having a thickness of 2 to 15 monolayers, preferably 2 to 8 monolayers, and more preferably 2 to 4 monolayers; and (d) plating a second cobalt film having a thickness of at least one monolayer on a surface of the antiferromagnetic layer of cobalt oxide, so as to allow the second cobalt film to form a ferromagnetic layer of cobalt.

The step (a) is performed under an ultrahigh vacuum environment, with the substrate placed in an ultrahigh vacuum environment with the vacuity maintained over $10^{-9}$ Torr. A surface of the substrate is bombarded by Ar ions. Inner electrons of the substrate are excised by high energy electrons or light of Auger Electron Spectroscopy (AES) to leave holes, and then, Auger electrons are released when the holes are filled up with outer electrons in such a way, so as to distinguish the surface components.

After thermal annealing, the sample surface is film-plated by thermal evaporation upon the surface structure of the sample is confirmed. Because cobalt can directly sublime, the heaterless design is adapted. After a cobalt source is ready, an adapter is connected to a feedthrough and the source is fixed on the adaptor. The feedthrough is electrified with a working current of about 3.9 ampere directly and makes the cobalt plating source generate heat and release cobalt atoms for plating cobalt on the substrate surface (the substrate at temperature of about 300 K). The time interval of cobalt plating is 5 minutes. Auger Electron Spectroscopy is used to confirm the surface components and the thickness of the film. The step of cobalt plating is repeated until the desired thickness of the cobalt film on the substrate surface is formed, for example, a cobalt film having a thickness of 1 to 15 monolayers, preferably about 1 to 8 monolayers, and more preferably about 1 to 4 monolayers.

The step (b) is performed to expose the substrate plated with a cobalt film to the oxygen atmosphere until saturation.

The step (c) is performed to heat the film sample for annealing for 10 minutes so as to make oxygen evenly react with cobalt and form a cobalt oxide layer after completing the aeration.

A larger amount of the hysteresis loop shifting can be obtained by increasing the temperature of thermal annealing. The step of thermal annealing in the method of the present invention is preferably performed at a temperature of 700 to 900 K. While the temperature is higher than 900 K, Co begins to diffuse into the Ir substrate and destroys the structure of the CoO layer, which adversely effects xchange coupling. On the other hand, while the annealing temperature is lower than 700 K, CoO can not form an excellent crystal structure due to the temperature not high enough, and therefore no exchange coupling occurs.

After the temperature of the film sample is down to less than 350 K, the step (d) is proceeded. The substrate surface having cobalt oxide is evaporated to form a cobalt film having a thickness of 1 to 15 monolayers, preferably 1 to 8 monolayers, and more preferably 1 to 4 monolayers so as to form an interface of oxygen/cobalt/cobalt oxide (O/Co/CoO). The sample of this film structure is field-cooled by applying a magnetic field of 1000 Oe. Under different temperature conditions between 230 and 300 K, the magnetism is measured by SMOKE. A phenomenon of a shifted hysteresis loop is found which indicats that the film sample is an ultrathin ferromagnetic/antiferromagnetic film. The coercivity ($H_C$) of the film decreases in response to the increase of the temperature ranging from 230 K to 300 K. Moreover, polar exchange field ($H_E$) decreases in response to the increase of the temperature ranging from 250 K to 300 K.

The features and effects of the present invention are illustrated in detail by the following examples. However, those examples are used mainly to explain the present invention, but not to limit the scope of the present invention.

EXAMPLE

Example 1

Under an ultrahigh vacuum environment with the background pressure about $5 \times 10^{-10}$ Torr, the film sample was made and the surface characteristics was measured. The relative concentration of the surface atoms was confirmed by Auger Electron Spectroscopy and the magnetic properties of the sample surface were observed by SMOKE. Theoretical values of Auger electronic signal ratios of Co 775 eV and Ir 229 eV under different cobalt thicknesses were simulated, and then were compared with relative concentrations resulting from experiments by Auger Electron Spectroscopy to obtain the thickness of the cobalt film on the Ir surface.

Firstly, the Ir (111) sample was repeatedly sputtered by $Ar^+$ ions and thermal annealed under an ultrahigh vacuum environment. Subsequently, the sample temperature was allowed to lower to room temperature, about 300 K, and ratios of Auger signal strengths of Co and Ir (111) were measured by Auger Electron Spectroscopy. When the ratio of signal strengths ($I_{C_{272}}/I_{Ir_{229}}$) was lower than 0.2, cobalt plating was performed. The time interval of cobalt plating was 5 minutes and the surface components and changes of the sample were measured by Auger Electron Spectroscopy every time after completing the cobalt plating. When the thickness of the cobalt film reached 2 ML, the sample was exposed to the oxygen atmosphere until saturation, and then was thermal annealed to 850 K for annealing for 10 minutes. Subsequently, 1 ML cobalt film was evaporated to form a film sample 1 having a structure of O/1 ML Co/2 ML CoO/Ir (111) due to the segregation of oxygen atoms. The film sample 1 was field-cooled under the condition of applying a magnetic field of 1000 Oe and its magnetism was measured by SMOKE at the temperatures of 250K, 260K, 270K, 280K, 290K and 300K, respectively. Results are shown in FIGS. 1(a) to 1(d).

Example 2

Figure 2:
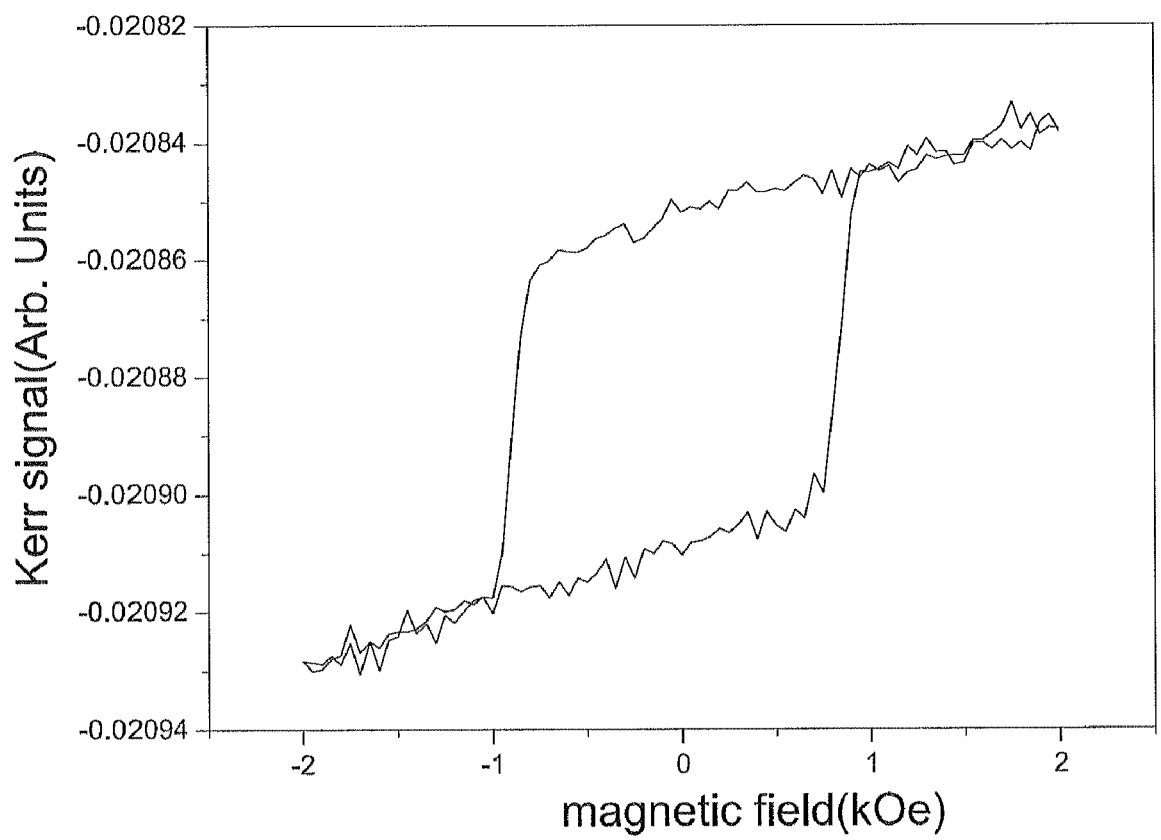
FIG. 2 shows a polar SMOKE diagram at 235K of the film sample 2 having a structure of O/1 ML Co/2 ML CoO/Ir (111) according to Example 2 of the present invention.
Figure 3A:
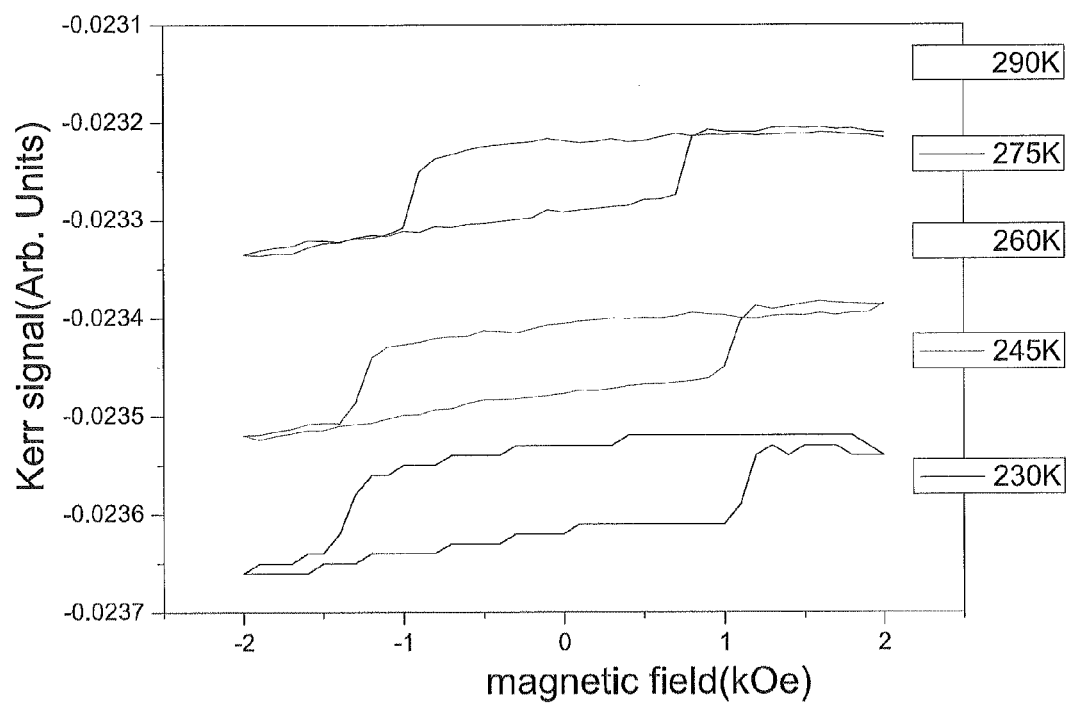
FIG. 3(a) shows a polar SMOKE diagram at different temperatures of the film sample 3 having a structure of O/1 ML Co/4 ML CoO /Ir (111) according to Example 3 of the present invention.
Figure 3B:
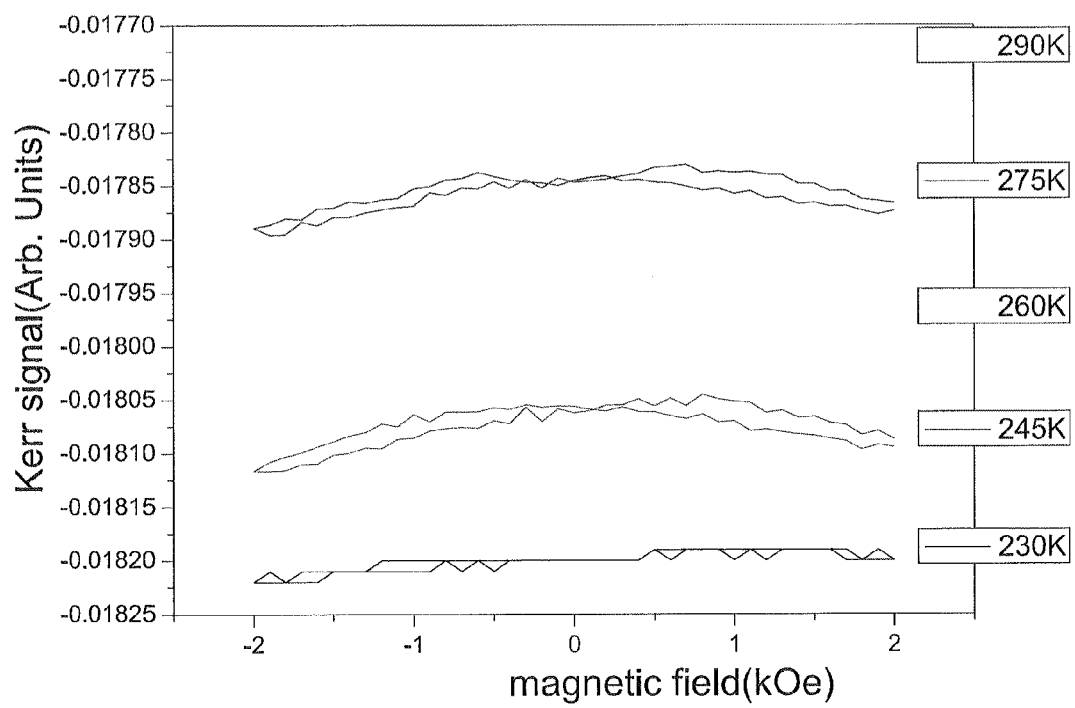
FIG. 3(b) shows a longitudinal SMOKE diagram at different temperatures of the film sample 3 having a structure of O/1 ML Co/4 ML CoO/Ir (111) according to Example 3 of the present invention.
Figure 3C:
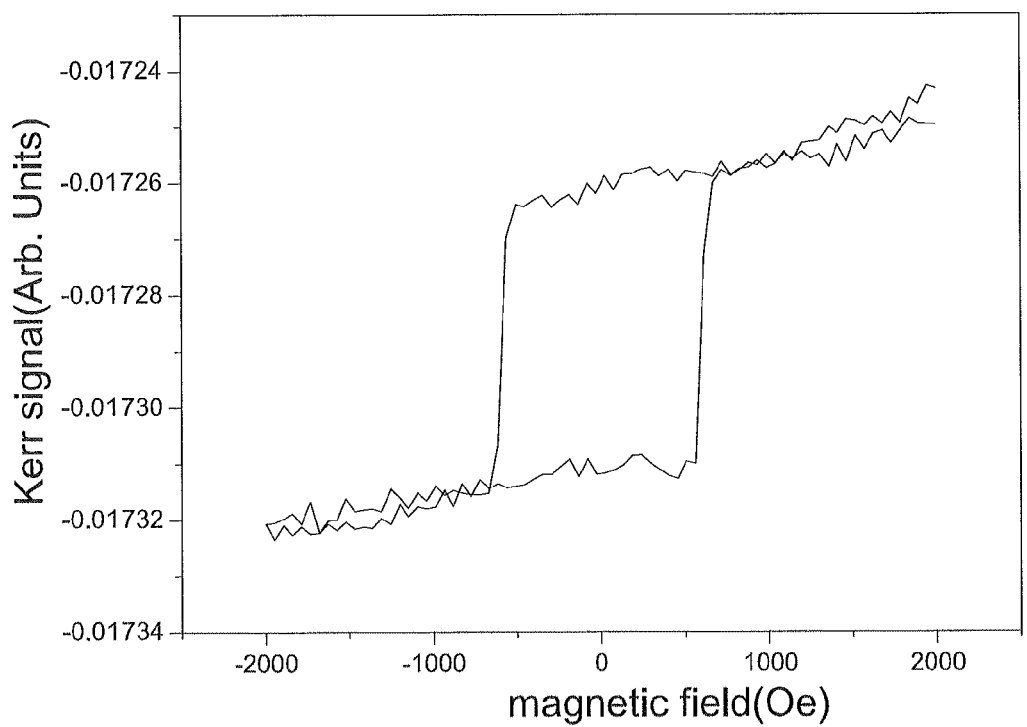
FIG. 3(c) shows a polar SMOKE diagram at 300 K of the film sample 3 having a structure of O/1 ML Co/4 ML CoO/Ir (111) according to Example 3 of the present invention.
Figure 3D:
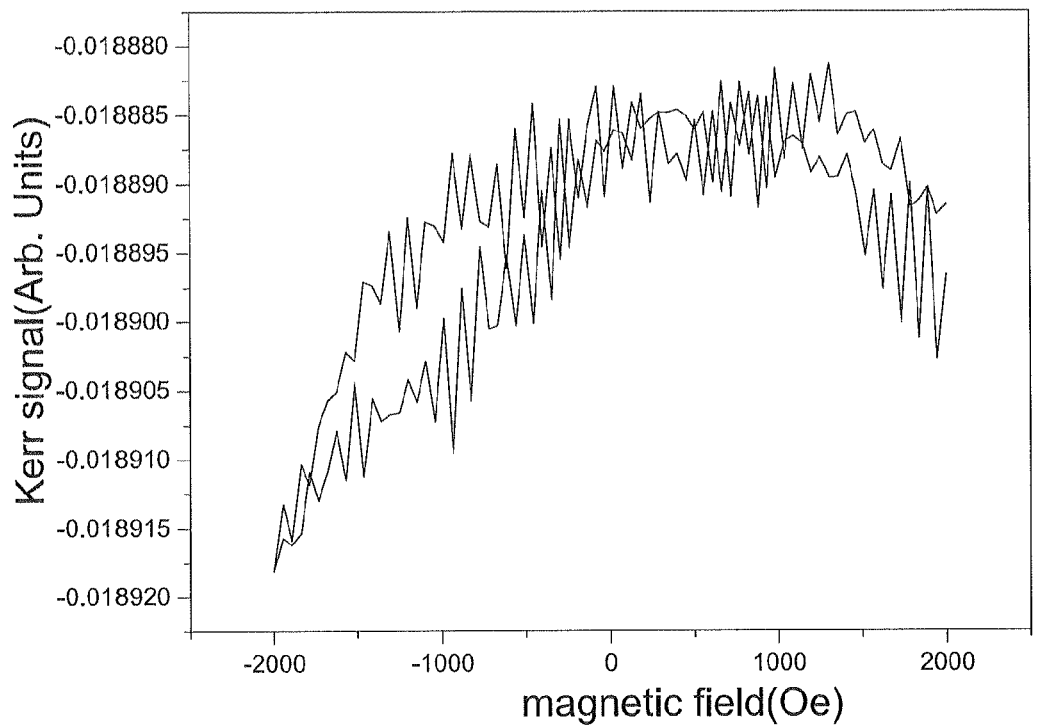
FIG. 3(d) shows a longitudinal SMOKE diagram at 300 K of the film sample 3 having a structure of O/1 ML Co/4 ML CoO/Ir (111) according to Example 3 of the present invention.

The steps in Example 1 were repeated for fabricating a film sample, but the temperature of thermal annealing was replaced with 700 K and therefore film sample 2 having a structure of O/1 ML Co/2 ML CoO/Ir (111) was formed. The film sample 2 was field-cooled and its magnetism was measured by SMOKE at 235K. Results are shown in FIG. 2 and reveal a phenomenon of a shifted hysteresis loop. Compared with the film sample 1, the amount of the hysteresis loop shifting of the film sample 2, which was thermal annealed by a lower temperature, is smaller.

Example 3

The steps in Example 1 were repeated for fabricating a film sample, i.e. film sample 3 having a structure of O/1 ML Co/4 ML CoO/Ir (111). The film sample 3 was field-cooled under the condition of applying a magnetic field of 1000 Oe and its magnetism was measured by SMOKE at the temperatures of 230K, 245K, 260K, 275K, 290K and 300K, respectively. Results are shown in FIGS. 3(a) to 3(d) and reveal that the shifting of hysteresis loop became more obvious when increasing the thickness of the antiferromagnetic layer to 4 ML of CoO film. The polar $H_C$ value decreased in response to the increase of the sample temperature between 230 K and 300K.

Examples 4-7

Figure 4:
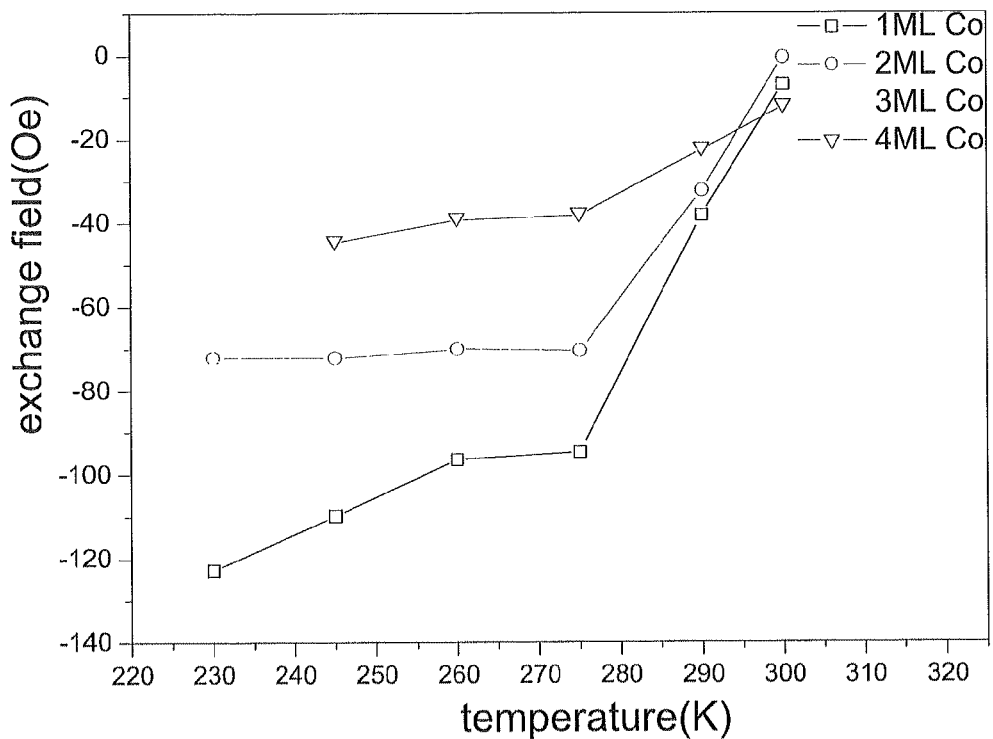
FIG. 4 shows a relationship between the polar exchange field and the temperature from film samples having different thicknesses of cobalt films, which were formed according to Examples 4-7 of the present invention.
Figure 5:
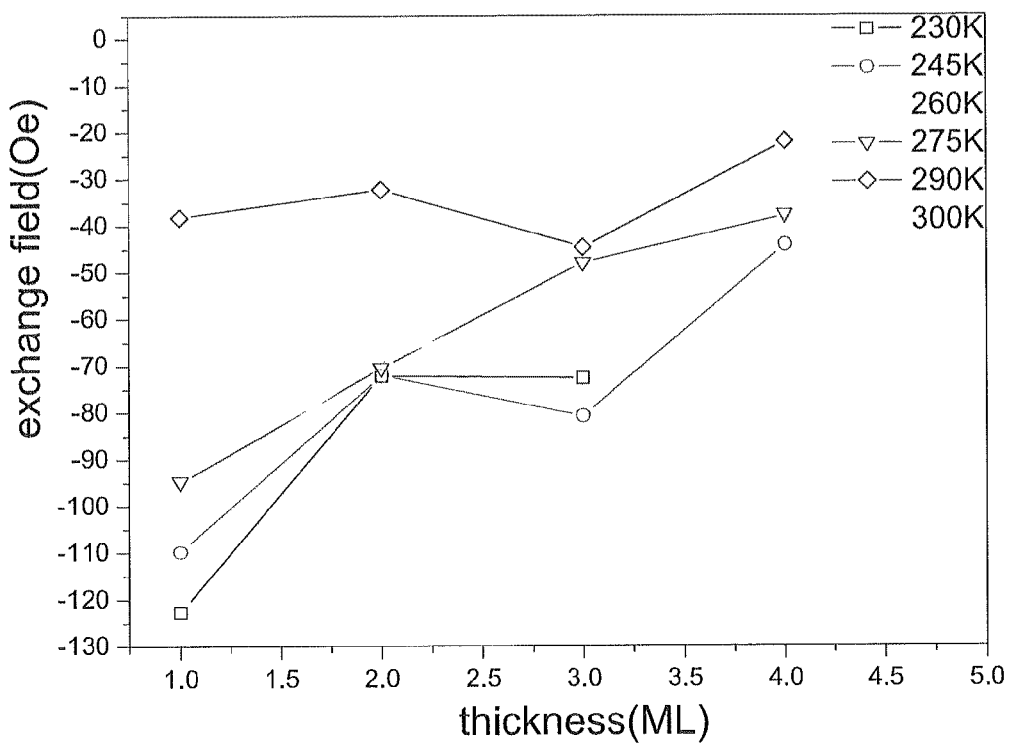
FIG. 5 shows a relationship between the polar exchange field and the thickness of the cobalt film from film samples, which were formed according to Examples 4-7 of the present invention.

The steps in Example 1 were repeated for fabricating samples and samples with different thicknesses of cobalt films, which were 1 ML, 2 ML, 3 ML and 4 ML respectively, were formed. Sample films were field-cooled under the condition of applying a magnetic field of 1000 Oe and their magnetism was measured by SMOKE at the temperatures of 230K, 245K, 260K, 275K, 290K and 300K, respectively. A relationship between the polar exchange field and the temperature is shown in FIG. 4. The $H_E$ value of the polar exchange field decreased in response to the increase of the sample temperature between 250 K and 300K. A relationship between the polar exchange field and the thickness of the cobalt film is shown in FIG. 5. $H_E$ value and thickness of the cobalt film represent an inverse relationship. $H_E$ value changes when the sample temperature is lower than 275 K.

Comparative Example 1

Figure 6:
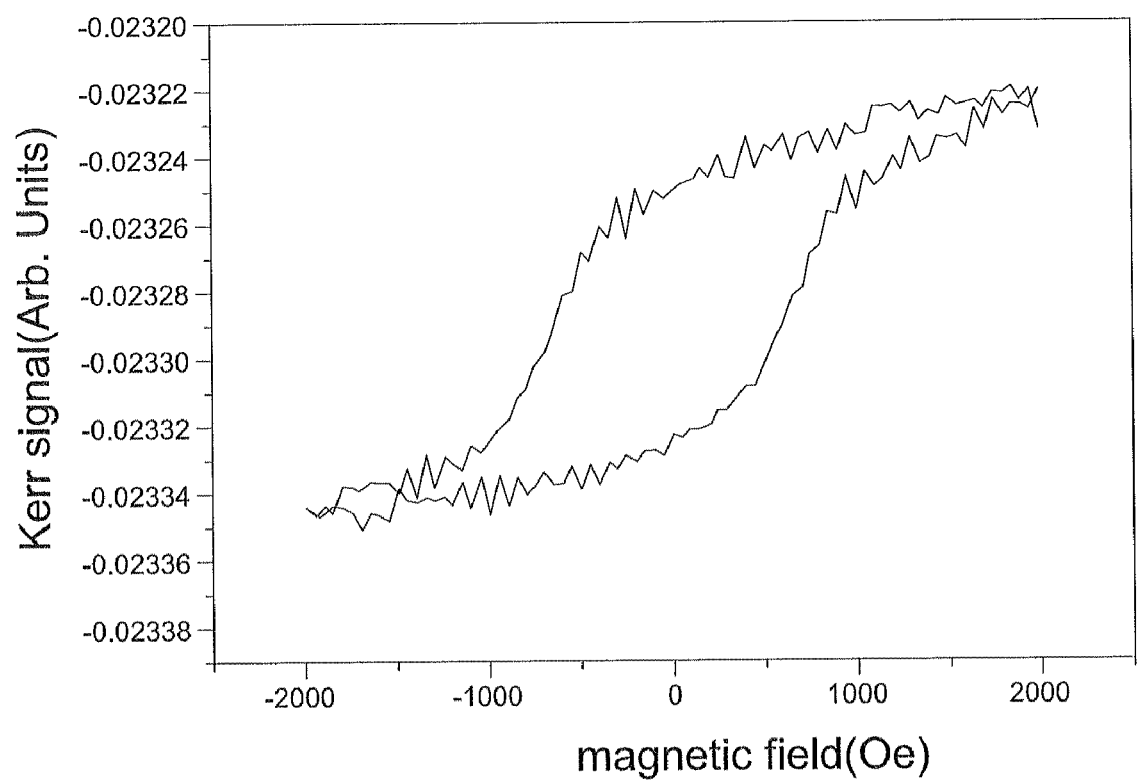
FIG. 6 shows a polar SMOKE diagram at 250 K of the film sample formed according to the Comparative Example 1 of the present invention.

The steps in Example 1 were repeated, and 3 ML Co was grown first. After exposing to the oxygen atmosphere is completed, the sample was thermal annealed at 600 K. Then, 1 ML Co was grown thereon to form a sample having a structure of 1 ML Co/3 ML Co—O/Ir. The sample was cooled down to 250 K and the magnetic signal was measured. It was found that a magnetic curve of the sample had bilateral symmetry and the sample did not have a property of exchange coupling as shown in FIG. 6. These results reveal that CoO cannot form an excellent crystal structure when the temperature of thermal annealing is not high enough, and therefore the Co/Co—O interface formed after Co plating did not have the property of exchange coupling.

The method of the present invention for manufacturing a ferromagnetic/antiferromagnetic coupling film can fabricate an ultrathin cobalt/cobalt oxide film in atomic-scaled limit, which is the thinnest ferromagnetic/antiferromagnetic structure so as to effectively reduce the size of a magnetic element and be particularly suitable for use in a spin valve type GMR head system or magnetic recording media.

It should be noted that the above examples only exemplificatively illustrate the principle and effects of the present invention and do not limit the present invention. The above examples can be modified and changed by those skilled in the art without infringing the spirit and scope of the present invention. Therefore, the claimed range of the present invention should be that listed in the following claims.

The invention claimed is:

1. A fabrication method of a ferromagnetic/antiferromagnetic coupling film structure, comprising the steps of:
    plating a first cobalt film having a thickness of at least two monolayers on a substrate;
    exposing the first cobalt film to oxygen atmosphere until saturation;
    heating the first cobalt film at a temperature ranging from 700 K to 900 K to form an antiferromagnetic layer of cobalt oxide having a thickness of 2 to 15 monolayers; and
    plating a second cobalt film having a thickness of 1 to 8 monolayers on the antiferromagnetic layer of cobalt oxide, so as to allow the second cobalt film to form a ferromagnetic layer of cobalt.

2. The method of claim 1, wherein the thickness of the first cobalt film is 2 to 8 monolayers.

3. The method of claim 1, wherein the first cobalt film has the thickness of 2 to 4 monolayers.

4. The method of claim 1, wherein the second cobalt film has the thickness of 1 to 4 monolayers.

* * * * *